(12) United States Patent
Cheng et al.

(10) Patent No.: US 8,405,160 B2
(45) Date of Patent: Mar. 26, 2013

(54) MULTI-STRAINED SOURCE/DRAIN STRUCTURES

(75) Inventors: Chun-Fai Cheng, Tin Shu Wai (HK);
Fung Ka Hing, Hsinchu (TW);
Ming-Huan Tsai, Zhubei (TW);
Chun-Feng Nieh, Hsinchu (TW); Yimin Huang, Hsinchu (TW); Han-Ting Tsai, Kaoshiung (TW); Haiting Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 275 days.

(21) Appl. No.: 12/787,972

(22) Filed: May 26, 2010

(65) Prior Publication Data

US 2011/0291201 A1 Dec. 1, 2011

(51) Int. Cl.
*H01L 27/088* (2006.01)
*H01L 21/8238* (2006.01)

(52) U.S. Cl. ...................... 257/396; 438/222
(58) Field of Classification Search .................. 257/336, 257/338, 18, 69, 396, 506; 438/199, 300, 438/222, 226, 413, 429
See application file for complete search history.

(56) References Cited

U.S. PATENT DOCUMENTS

| 7,078,285 B1 * | 7/2006 | Suenaga | 438/199 |
| 7,335,959 B2 * | 2/2008 | Curello et al. | 257/408 |
| 7,479,432 B2 * | 1/2009 | Murthy et al. | 438/300 |
| 2004/0262683 A1 * | 12/2004 | Bohr et al. | 257/338 |
| 2008/0128746 A1 | 6/2008 | Wang | |

FOREIGN PATENT DOCUMENTS

CN 1926693 3/2007

OTHER PUBLICATIONS

Chinese Patent Office, Office Action dated Aug. 14, 2012, Application No. 201010589516.6, 7 pages.

* cited by examiner

*Primary Examiner* — Calvin Lee
(74) *Attorney, Agent, or Firm* — Haynes and Boone, LLP (57) ABSTRACT

The present disclosure provides a semiconductor device. The semiconductor device includes a silicon substrate. The semiconductor device includes first and second regions that are disposed in the substrate. The first and second regions have a silicon compound material. The semiconductor device includes first and second source/drain structures that are partially disposed in the first and second regions, respectively. The semiconductor device includes a first gate that is disposed over the substrate. The first gate has a first proximity to the first region. The semiconductor device includes a second gate that is disposed over the substrate. The second gate has a second proximity to the second region. The second proximity is different from the first proximity. The first source/drain structure and the first gate are portions of a first transistor, and the second source/drain structure and the second gate are portions of a second transistor.

18 Claims, 11 Drawing Sheets

MULTI-STRAINED SOURCE/DRAIN STRUCTURES

TECHNICAL FIELD

The present disclosure relates generally to fabrication of semiconductor devices, and more particularly, to fabrication of strained source/drain structures.

BACKGROUND

The semiconductor integrated circuit (IC) industry has experienced rapid growth. Technological advances in IC materials and design have produced generations of ICs where each generation has smaller and more complex circuits than the previous generation. To enhance the performance of ICs, strained source/drain regions may be used. However, a single IC chip may have different types of transistors. These different types of transistors may need to be optimized differently, which means the strained source/drain structures for these different types of transistors may need to be configured and implemented differently. However, current methods of fabricating strained source/drain structures do not take into these different optimization needs into account.

Therefore, while existing methods of fabricating strained source/drain structures have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

One of the broader forms of the present disclosure involves a semiconductor device. The semiconductor device includes: a substrate having first and second strained regions; a first transistor having a first gate disposed on the substrate, the first strained region and the first gate being separated by a first distance; and a second transistor having a second gate disposed on the substrate, the second strained region and the second gate being separated by a second distance that is different from the first distance.

Another of the broader forms of the present disclosure involves a semiconductor device. The semiconductor device includes: a silicon substrate; first and second regions disposed in the substrate, the first and second regions including a silicon compound material; first and second source/drain structures partially disposed in the first and second regions, respectively; a first gate disposed over the substrate, the first gate having a first proximity to the first region; and a second gate disposed over the substrate, the second gate having a second proximity to the second region, the second proximity being different from the first proximity; wherein the first source/drain structure and the first gate are portions of a first transistor, and wherein the second source/drain structure and the second gate are portions of a second transistor.

Still another of the broader forms of the present disclosure involves a method of fabricating a semiconductor device. The method includes: providing a substrate; forming a gate over the substrate; forming a spacer on a sidewall of the gate; implanting a dopant into a region of the substrate, the gate and the region being disposed adjacent to the spacer and on opposite sides of the spacer; and forming a strained structure in the region.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
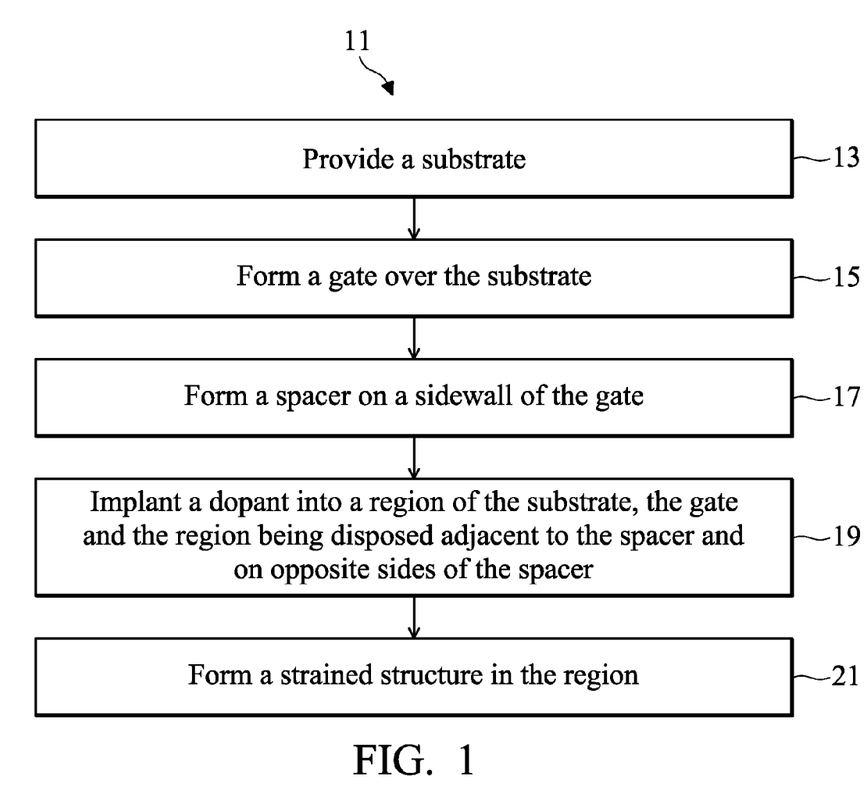
FIG. 1 is a flowchart illustrating a method of forming a semiconductor device according to various aspects of the present disclosure.

FIG. 1 is a flowchart of a method 11 for fabricating a semiconductor device. The method 11 begins with block 13 in which a substrate is provided. The method 11 continues with block 15 in which a gate is formed over the substrate. The method 11 continues with block 17 in which a spacer is formed on a sidewall of the gate. The method 11 continues with block 19 in which a dopant is implanted into a region of the substrate. The gate and the region are disposed adjacent to the spacer and are on opposite sides of the spacer. The method 11 continues with block 21 in which a strained structure is formed in the region.

FIGS. 2-9 are diagrammatic fragmentary cross-sectional side views of a semiconductor device 40 at various stages of fabrication in accordance with an embodiment of the method 11 of FIG. 1. It is understood that FIGS. 2-9 have been simplified for a better understanding of the inventive concepts of the present disclosure. Accordingly, it should be noted that additional processes may be provided before, during, and after the method 11 of FIG. 1, and that some other processes may only be briefly described herein.

Figure 2:
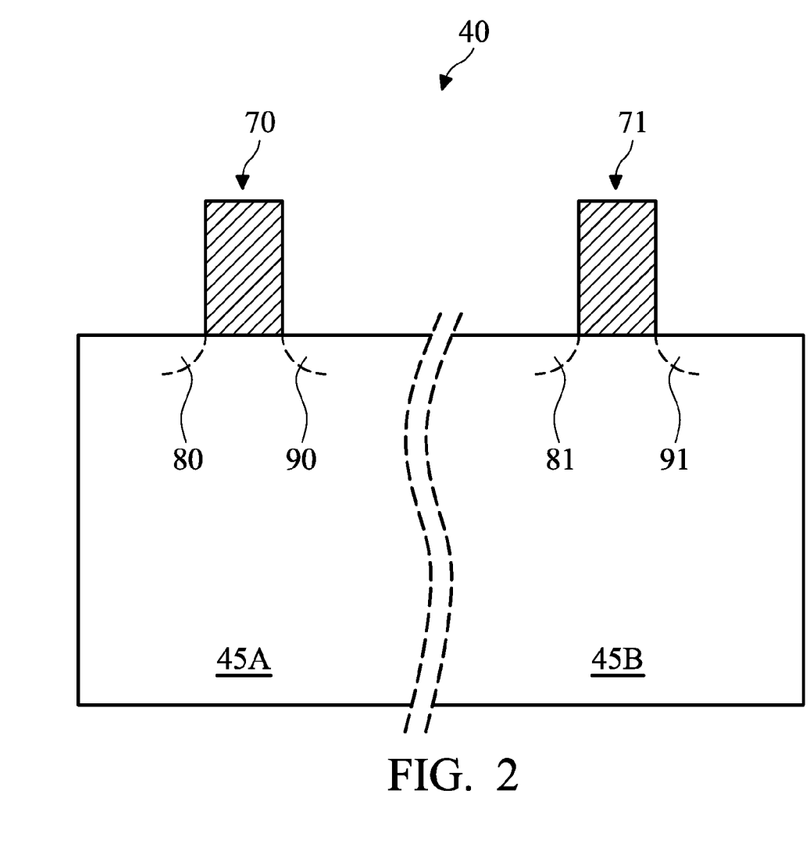
FIGS. 2-9 are diagrammatic fragmentary cross-sectional side views of a semiconductor device at various stages of fabrication in accordance with an embodiment of the method of FIG. 1.

Referring to FIG. 2, the semiconductor device 40 is an N-type device having a P-type silicon substrate 45 that is doped with a P-type dopant such as boron. In another embodiment, the semiconductor device 40 may be a P-type device having an N-type substrate that is doped with an N-type dopant such as arsenic or phosphorous.

Gate structures 70-71 are formed over substrate regions 45A and 45B, respectively. The regions 45A and 45B are separated by broken curved lines shown in FIG. 2. The gate structures 70-71 each include a gate dielectric layer and a gate electrode layer. For the sake of simplicity, these gate dielectric layers and gate electrode layers are not individually illustrated. The gate dielectric layers and gate electrode layers may be formed by chemical vapor deposition (CVD), physical vapor deposition (PVD), or another suitable technique. In an embodiment, the gate dielectric layers include an oxide material, and the gate electrode layers include a polysilicon material.

In an alternative embodiment, the gate dielectric layers include a high-k dielectric material, and the gate electrode layers include a metal material. The high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The metal material in the gate electrode layers includes a work function metal portion and a fill metal portion. In an embodiment, the work function metal portion is an N-type work function metal (N-metal), which may include Ti, Al, Ta, $ZrSi_2$, TaN, or combinations thereof. In another embodiment, the work function metal portion is a P-type work function metal (P-metal), which may include Mo, Ru, Ir, Pt, PtSi, MoN, WNx, or combinations thereof. Based on the material composition, the work function metal portions may be used to tune work function values of transistors associated with the gate structures 70-71, so that a desired threshold voltage $V_t$ is achieved for each of the gate structures 70-71.

The fill metal portions of the gate electrode layers include one of tungsten (W), Aluminum (Al), copper (Cu), and combinations thereof, and respectively serve as the main conductive portions of the gate electrode layers of the gate structures 70-71.

Referring back to FIG. 2, after the gate structures 70-71 are formed, lightly doped source/drain regions 80-81 and 90-91 are formed in the substrate 45. The lightly doped source/drain regions 80 and 90 are disposed on opposite sides of the gate structure 70, and the lightly doped source/drain regions 81 and 91 are disposed on opposite sides of the gate structure 71.

It is understood that the lightly doped source/drain regions 80-81 and 90-91 may each serve as a portion of a source structure of a transistor or as a portion of a drain structure of a transistor.

Figure 3:
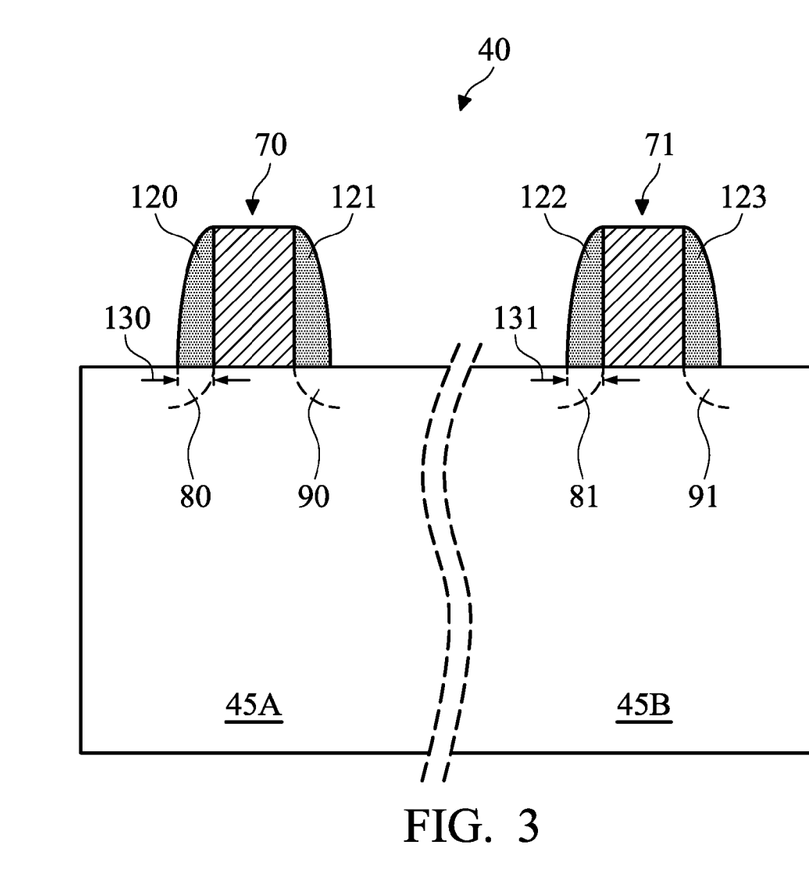

Referring now to FIG. 3, spacers 120-121 are formed on opposite sidewalls of the gate structure 70, and spacers 122-123 are formed on opposite sidewalls of the gate structure 71. The spacers 120-123 each include a suitable dielectric material such as silicon nitride, silicon oxide, silicon oxy-nitride, or combinations thereof. In an embodiment, the spacers 120-123 each include an oxide-nitride-oxide (ONO) structure, that is, a layer of nitride disposed in between two oxide layers. For the sake of simplicity, the specific structural details inside the spacers 120-125 are not illustrated herein.

The spacers 120-121 each have a spacer width (or spacer thickness) 130, the spacers 122-123 each have a spacer width (or spacer thickness) 131. The spacers widths 130 and 131 may be different from one another to achieve different initial proximity control. Various techniques may be used to form the spacers 120-123 in a manner so that they have different spacer widths 130-131. These techniques may involve the use of one or more photolithography processes, deposition processes, and etching processes (for example, anisotropic etching processes). As an example, the spacer widths 130-131 may be controlled by adjusting etching time.

Figure 4:
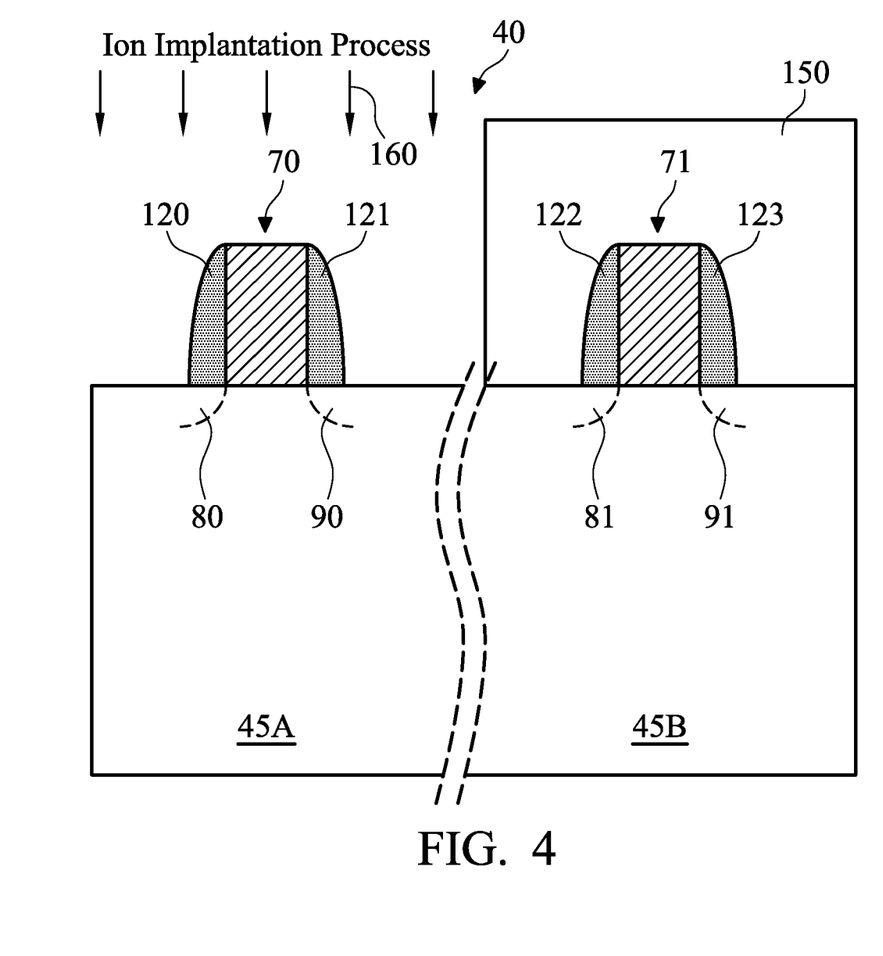

Referring now to FIG. 4, a photoresist mask 150 is formed over the substrate regions 45B to protect the gate structure 71. An ion implantation process 160 is then performed on the substrate region 45A. It is understood that the gate structure 70 may be protected by a hard mask (not illustrated) during the ion implantation process 160. In one embodiment, the ion implantation process 160 implants a dopant, which can enhance etching rate of subsequent etching processes, including arsenic with an energy range of 1 keV to 10 keV, a dose range of $1E14$ $cm^{-2}$ to $3E15$ $cm^{-2}$. An angle implant technique may also be applied with a tile angle in a range from of 0° to 25° with respect to a direction normal to the substrate.

Figure 5:
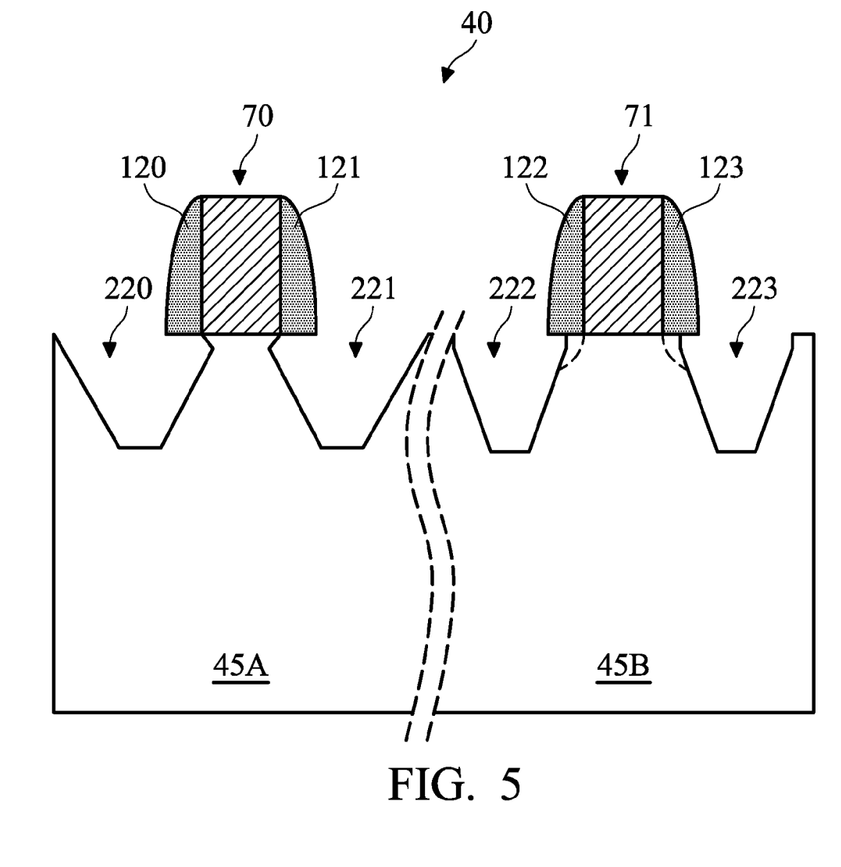

Referring now to FIG. 5, the photoresist mask 150 is removed. A thermal annealing process (not illustrated) for dopant activation may be performed. Thereafter, recesses 220-223 are formed in the portions of the substrate regions 45A-45B that have been implanted. In particular, recesses 220 and 221 are formed in the implanted portions of the substrate region 45A on opposite sides of the gate structure 70. Recesses 222 and 223 are formed in the implanted portions of the substrate region 45B on opposite sides of the gate structure 71.

The recesses 220-223 are formed by an etching process known in the art, for example a selective wet etching process, or a dry etching process followed by a selective wet etching process. In the selective wet etching process, a dopant selective wet etchant, such as tetra-methyl ammonium hydroxide (TMAH) solution with a volume concentration range of 1% to 10% and a temperature range of 15° C. to 50° C., may be used. In alternative embodiments, other selective wet etching solutions, such as ammonium hydroxide ($NH_4OH$), amine-based etching solution may also be used. The etching rate, including a lateral etching rate, of the substrate regions 45A-45B are affected by factors including:

type of dopant implanted. For example, if arsenic ions are used as the dopant, then the lateral etching rate is greater than if boron ions are used as the dopant.

concentration of the dopant in the implanted regions. The concentration is correlated to the dosage of the dopant used in the implantation process 160.

In other words, the etching rate (including the lateral etching rate) of the implanted portions of the substrate regions 45A-45B are correlated to the type and the dosage of the dopant used in the implantation process. These factors may also affect the profile of the recesses 220-223. In an embodiment, the recesses 220-221 and the recesses 222-223 have different profiles. The recesses 220 and 221 laterally extend underneath the gate structure 70, while the recesses 222 and 223 laterally extend underneath the spacers 122 and 123, respectively, but not under the gate structure 71.

It is understood that the profiles and lateral extensions of the recesses 220-223 discussed above are merely exemplary and are provided to facilitate ensuing discussions. Various alternative combinations of dopant types and dosages may be used in other embodiments to achieve the desired profiles and lateral extension of the recesses, depending on the design and manufacturing needs and requirements.

Figure 6:
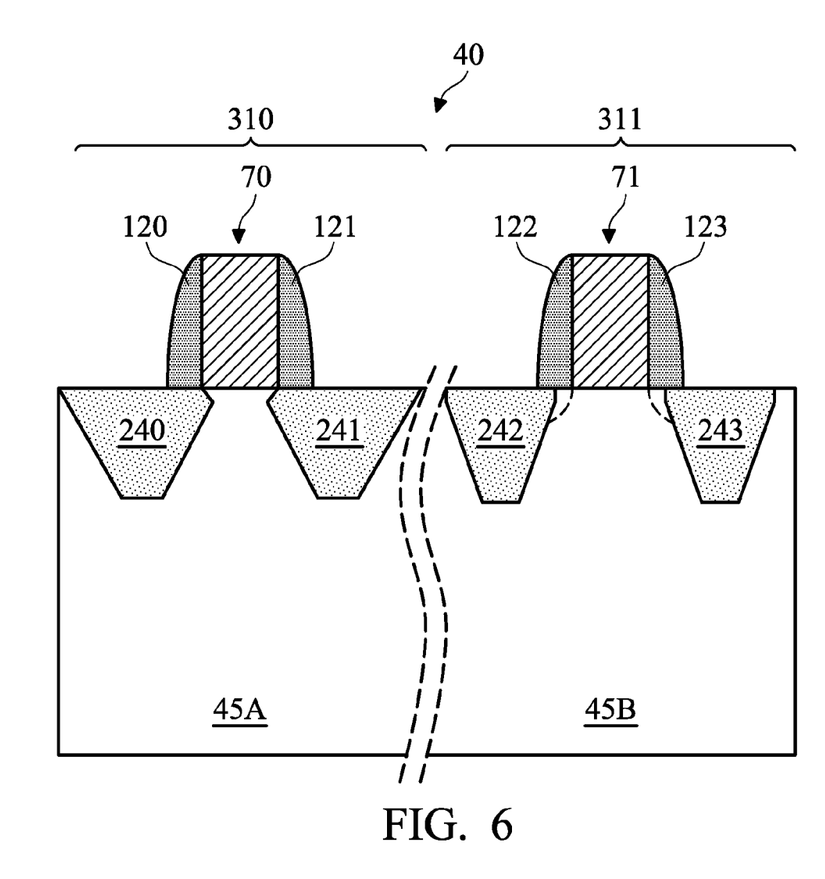

Referring now to FIG. 6, strained structures 240-243 are formed in the recesses 220-223 (FIG. 5), respectively. In an embodiment, the strained structures 240-243 are formed by a selective-epitaxial-growth process (SEG, also referred to as an epi-growing process) known in the art. The SEG process may include a low deposition CVD process, or may alternatively include an atomic layer deposition (ALD) process. In addition, temperature of the substrate 45 may be kept relatively low in the SEG process.

The strained structures 240-245 each include a silicon compound. In the embodiment where the substrate 45 is a P-type substrate (NMOS device), the strained structures 240-243 include a silicon carbide material. In the embodiment where the substrate 45 is an N-type substrate (PMOS device), the strained structures 240-243 include a silicon germanium material. Also, the SEG process may allow the strained structures 240-243 to form in a manner so that they protrude outside the recesses 220-223 (FIG. 5) and above a top surface of the substrate 45. In other words, the strained structures 240-243 may not be substantially co-planar with a top surface of the substrate 45. However, this protrusion is not illustrated in FIG. 6 for reasons of simplicity and clarity.

Figure 7:
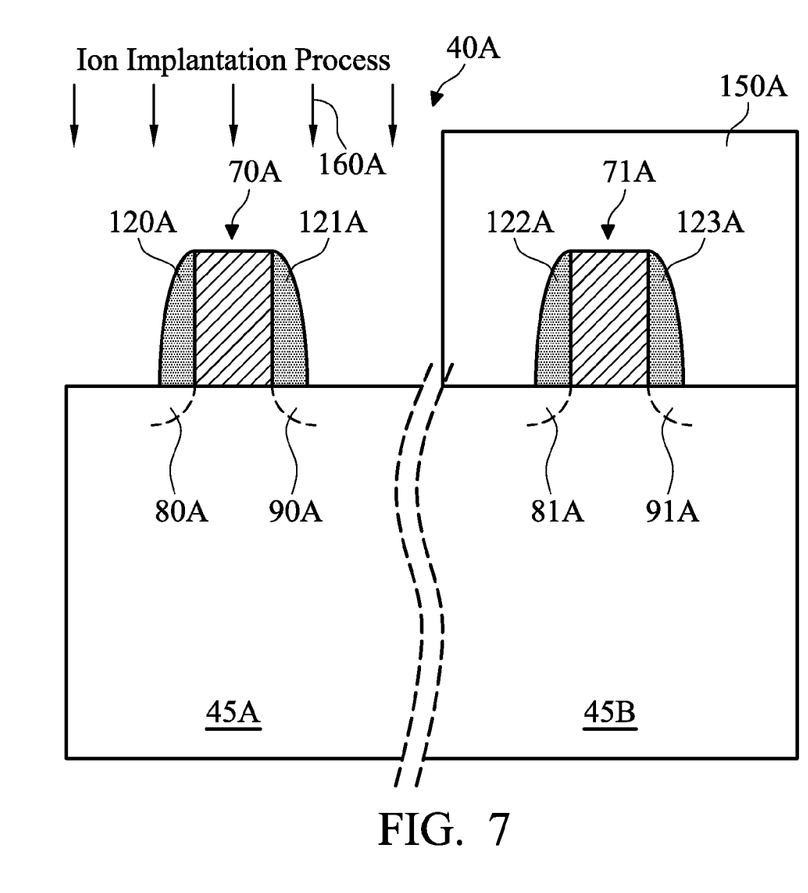
Figure 8:
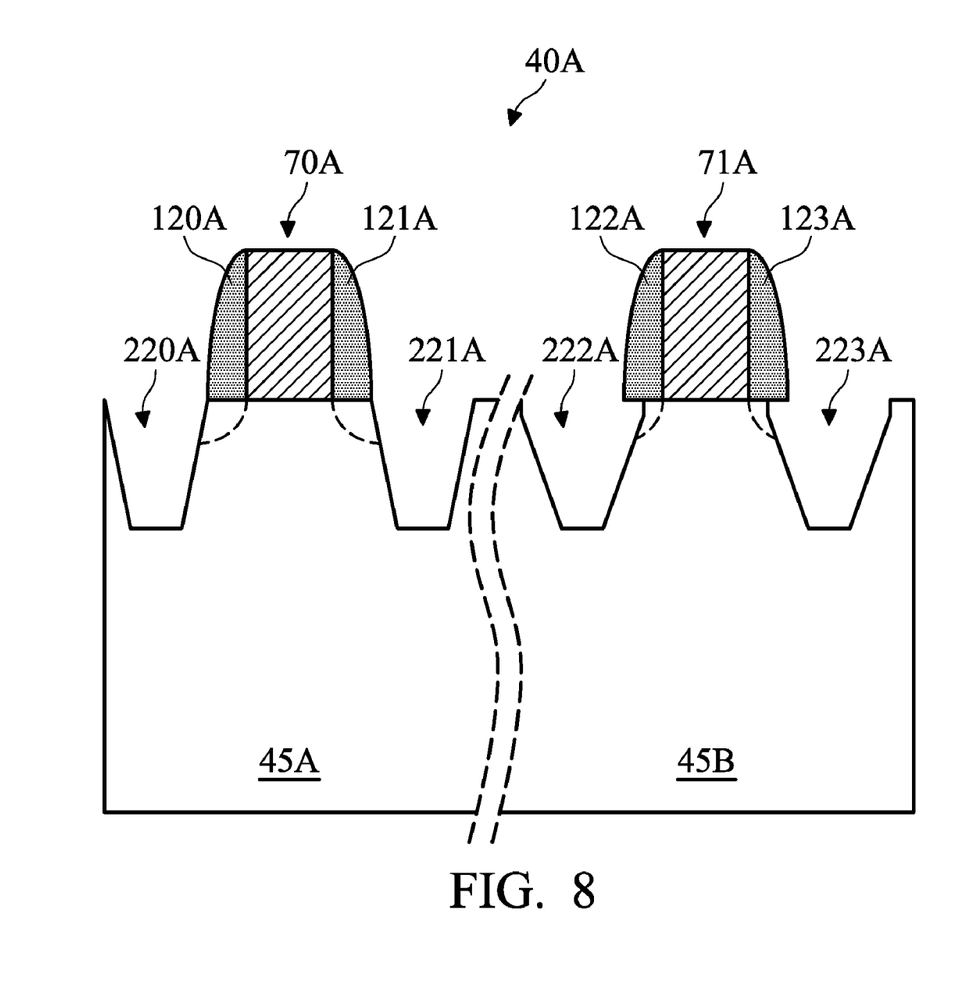
Figure 9:
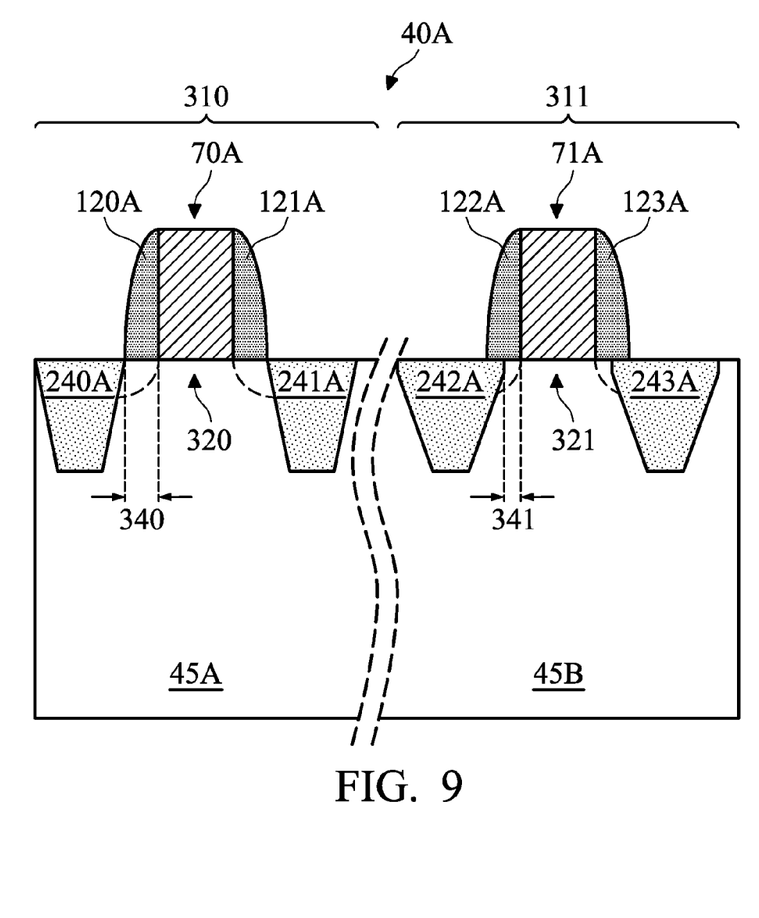

FIG. 7 to FIG. 9 show a similar process as mentioned in FIGS. 3 to 5. For the sake of simplicity, similar regions and processes are labeled the same but with the letter "A" appended to each reference numeral. In one embodiment, the ion implantation process 160A implants a dopant, which can retard etching rate of subsequent etching process, including $BF_2$ with an energy range of 0.5 keV to 5 keV, a dose range of $1E14$ $cm^{-2}$ to $3E15$ $cm^{-2}$. An angle implant technique may also be applied with a tilt angle in a range from 0° to 25° with respect to a direction normal to the substrate. The recesses 220A-223A are etched differently from the recesses 220-223 in FIG. 5, thus the strained regions 240A-243A are formed to have different profiles than the strained regions 240-243 in FIG. 6.

For example, the recesses 220 and 221 (FIG. 5) are not aligned with the spacers 120 and 121, but extend underneath the spacers 120 and 121, respectively. In comparison, the recesses 220A and 221A (FIG. 8) are substantially aligned with the outer edges of the spacers 120A and 121A, respectively. As another example, the recesses 222 and 223 (FIG. 5) extend underneath the spacers 122 and 123, respectively, and the recesses 222A and 223A (FIG. 5) also extend underneath the spacers 122A and 123A, respectively. But the recesses 222 and 222A may have different amounts of lateral extension underneath the spacers 122 and 122A, and the recesses 223 and 223A have different amounts of lateral extension underneath the spacers 123 and 123A. It is also understood that the recesses 222 and 223 do not extend underneath the gate structure 71, and the recesses 222A and 223A do not extend underneath the gate structure 71A.

A transistor 310 is formed, which includes the gate structure 70A and the strained regions 240A-241A. A transistor 311 is formed, which includes the gate structure 71A and the strained regions 242A-243A. The transistor 310 includes a conductive channel region 320 that is underlying and substantially aligned with the gate structure 70A. The transistor 311 includes a conductive channel region 321 that is underlying and substantially aligned with the gate structure 71A.

The strained structures 240A-243A may enhance the performance of the semiconductor device 40A. For example, the strained structures 240A-243A may result in a mismatch of their lattice constants and the lattice constant of the silicon substrate 45. This mismatch creates stress, which increases mobility of charge carriers (electrons or holes) in the semiconductor device 40A. The increased mobility may result in a greater transconductance—the change in the drain current divided by the change in the gate voltage—of the transistors 310-311.

For the transistor 310, a distance 340 separates the strained structure 240A (or 241A) and the channel region 320. For the transistor 311, a distance 341 separates the strained structure 242A and the channel region 321. The distances 340-341 may be substantially different from one another. In the embodiment shown in FIG. 9, the distance 340 is less than the distances 341. For example, the distance 340 may be in a range that is less than approximately 4 nanometers (nm), the distance 341 may be in a range that is greater than approximately 4 nm.

The distances 340-341 respectively represent proximities or spacing between the strained structures 240A-243A and their respective channel regions 320-321. These distances 340-341 (proximities) are correlated with characteristics and properties of the transistors 310-311.

The transistors 310-312 may be different types of transistors and may have different optimization needs for technologies such as system-on-chip (SOC) technology. For example, it may be important for a high performance transistor to have a relatively large transconductance and thus a large mobility. As such, to optimize the high performance transistor, the proximity between its strained structures and its channel region should be minimized.

However, for an input/output and low power logic transistor, reducing strained source/drain proximity may lead to large junction leakage and reliability issue. Different strained source/drain proximities may be required for performance optimization of different transistors.

In a traditional semiconductor device (e.g., an IC chip) having multiple types of strained transistors, these different optimization needs are not taken into account when designing the proximities. In other words, the proximities between the strained structures and the channel regions are not separately adjusted to optimize the performance of each type of transistor in the traditional semiconductor device. Rather, often times a single proximity is used for all types of transistors in the semiconductor device.

In comparison, the embodiments disclosed herein offer advantages with respect to optimization flexibility. For example, the spacer widths 130-131 (FIG. 3) of the spacers 120-123 may be individually adjusted so that the recesses 220-223 (FIG. 5) may be formed closer or farther away from the gate structures 70-71. The distances between the recesses 220-223 and their respective gate structures 70-71 affects (or is correlated to) the proximities between the strained structures 240-243 and the channel regions 320-321. In addition, the ion implantation process 160 (FIG. 4) can be adjusted to tune the lateral etching rate of the implanted portions of the substrate regions 45A-45B. As such, the profile and lateral extension of each of the recesses 220-223 may be individually controlled as well. This means that the location and the shapes of the strained structures 240-243 may be individually controlled as well.

The method of adjusting spacer thicknesses and the method of forming different recesses discussed above may be used separately or in combination to achieve a desired proximity between the strained structures 240-243 and the channel regions 320-321 for each of the transistors 310-311. Thus, each of the transistors 310-311 may be optimized based on its transistor type and its own functional purpose. As an example, the transistor 310 may be a high performance transistor. Thus, the distance 340 (proximity between the strained structures 240-241 and the channel region 320) is smaller than the transistors 311 illustrated in FIG. 9. In other words, the transistor 310 is optimized for high performance.

In the manner outlined above, the embodiments disclosed herein allows for flexible optimization for different transistors that are on a single semiconductor device. However, it is understood that other embodiments may offer different advantages, and that no particular advantage is required for all embodiments.

Figure 10:
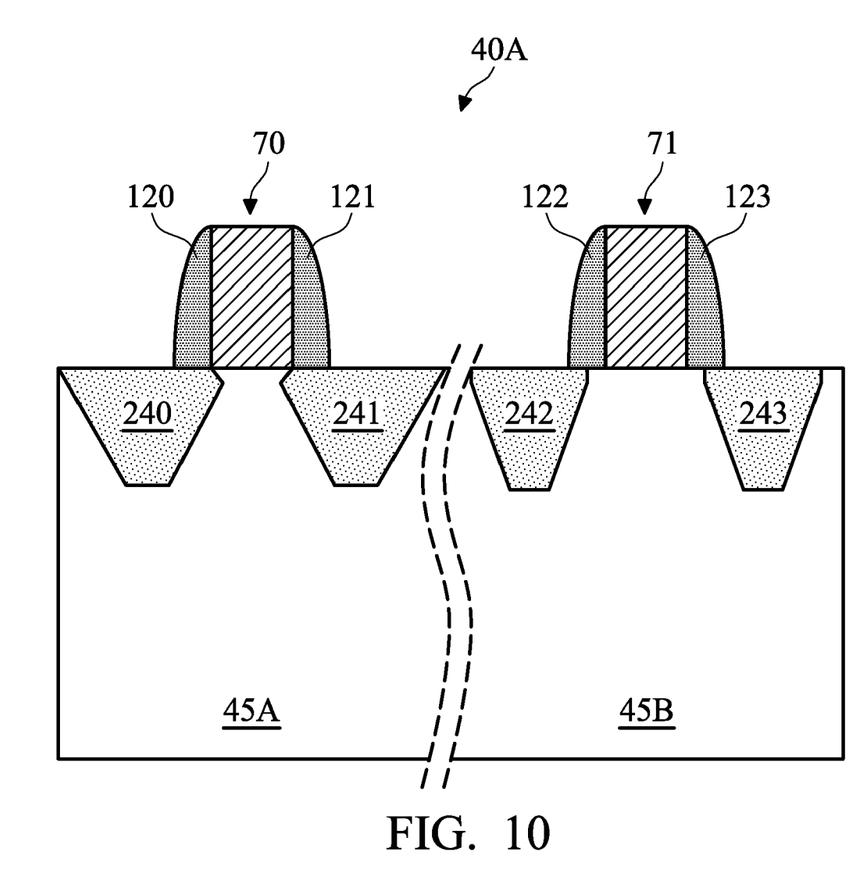
FIGS. 10-11 are diagrammatic fragmentary cross-sectional side views of a semiconductor device at various stages of fabrication in accordance with an alternative embodiment of the method of FIG. 1.
Figure 11:
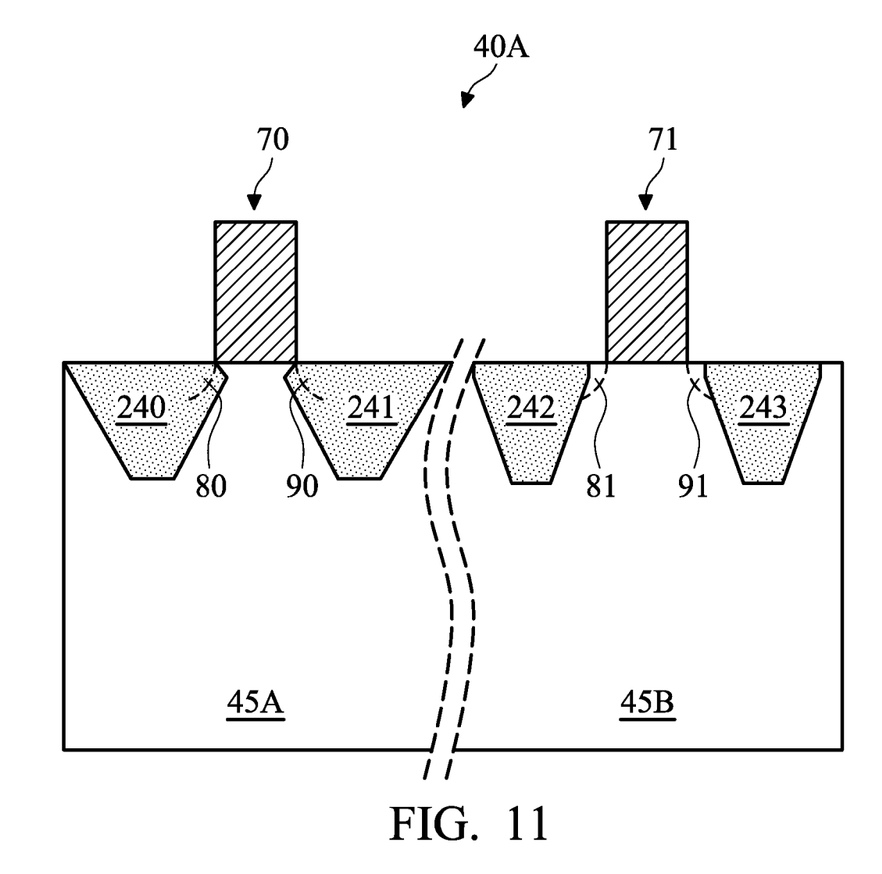

FIGS. 10-12 are diagrammatic cross-sectional side views of a semiconductor device 40A fabricated in accordance with an alternative embodiment of the method 11 of FIG. 1. For the sake of simplicity and consistency, similar structures, devices, and processes are labeled the same as in FIGS. 2-9. Referring now to FIG. 10, fabrication processes that are substantially similar to those discussed above with reference to FIGS. 2-8 are used to fabricate the semiconductor device 40A, except that lightly doped source/drain regions are not formed yet. In other words, gate structures 70-71 are respectively formed over the substrate regions 45A-45B, the spacers 120-123 having varying widths or thicknesses are formed around the gate structures 70-71, the recesses 220-223 having different profiles and lateral extensions are formed in the substrate regions 45A-45B, and the strained structures 240-243 are epi-grown in the recesses 220-223, respectively.

Referring now to FIG. 11, the spacers 120-123 (shown in FIG. 10) serve as dummy spacers in this embodiment and are removed after the formation of the strained structures 240-243. Thereafter, an ion implantation process (not illustrated) is used to form the lightly doped source/drain regions 80-81 and 90-91. Thus, the lightly doped source/drain regions 80-81 and 90-91 may partially extend into the strained structures 240-243.

For reasons similar to those discussed above with reference to the embodiment illustrated in FIGS. 2-9, the embodiment illustrated in FIGS. 10-11 also allows for separately controlling the proximity between the strained structures 240-243 and the channel regions 320-321 for each individual transistor. Thus, this embodiment may offer similar advantages as those discussed above. Depending on fabrication concerns and ease of implementation, a person skilled in the art may select either the embodiment illustrated in FIGS. 2-9 or the embodiment illustrated in FIGS. 10-11 to carry out the optimization of different transistors on a single semiconductor device.

It is understood for each of the embodiments shown above, additional processes may be performed to complete the fabrication of the semiconductor device. For example, these additional processes may include formation of self-aligned silicides (salicides), formation of contacts, formation of interconnect structures (e.g., lines and vias, metal layers, and interlayer dielectric that provide electrical interconnection to the semiconductor device), formation of passivation layers, and packaging of the semiconductor device. For the sake of simplicity, these additional processes are not described herein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the semiconductor device may not be limited to an NMOS device and can be extended to a PMOS device with a similar structure and configuration except that all doping types may be reversed and dimensions are modified according to PMOS design.

What is claimed is:

1. A semiconductor device, comprising:
a silicon substrate;
first and second regions disposed in the substrate, the first and second regions including a silicon compound material;
first and second source/drain structures partially disposed in the first and second regions, respectively;
a first gate disposed over the substrate, the first gate having a first proximity to the first region; and
a second gate disposed over the substrate, the second gate having a second proximity to the second region, the second proximity being different from the first proximity;
wherein the first source/drain structure and the first gate are portions of a first transistor, and wherein the second source/drain structure and the second gate are portions of a second transistor.

2. The semiconductor device of claim 1, wherein the silicon compound material includes one of: a silicon germanium material and a silicon carbide material.

3. The semiconductor device of claim 1, wherein the first and second distances are substantially different.

4. The semiconductor device of claim 1, further including first and second spacers that are disposed on sidewalls of the first and second gates, respectively, the first and second spacers having different widths.

5. A semiconductor device, comprising:
a substrate having first and second strained regions;
a first transistor having a first gate disposed on the substrate, the first strained region and the first gate being separated by a first distance; and
a second transistor having a second gate disposed on the substrate, the second strained region and the second gate being separated by a second distance that is greater than the first distance, wherein the first and second transistors respectively include first and second channel regions underlying the first and second gates, wherein a first separation between the first strained region and the first channel region is less than a second separation between the second strained region and the second channel region.

6. The semiconductor device of claim 5, wherein:
the first transistor further includes a first source/drain region disposed in the substrate, a portion of the first source/drain region overlapping with the first strained region; and
the second transistor further includes a second source/drain region disposed in the substrate, a portion of the second source/drain region overlapping with the second strained region.

7. The semiconductor device of claim 5, wherein the first and second strained regions each include one of: a silicon germanium material and a silicon carbide material.

8. The semiconductor device of claim 5, wherein the first and second transistors respectively include first and second gate spacers, the second gate spacer being thicker than the first gate spacer.

9. The semiconductor device of claim 5, wherein the first and second strained regions have different shapes.

10. The semiconductor device of claim 5, wherein the first and second transistors are different types of transistors.

11. A semiconductor device, comprising:
a substrate having a first region and a second region, wherein the first region is adjacent the second region;
a first gate formed on the first region of the substrate;
a first gate spacer formed on the first gate;
a first strained region spaced apart from the first gate a first distance;
a second gate formed on the second region of the substrate;

a second gate spacer formed on the second gate; and a second strained region spaced apart from the second gate a second distance, wherein the second distance is different than the first distance, wherein the first and second gates respectively include first and second channel regions underlying, wherein a first separation between the first strained region and the first channel region is different than a second separation between the second strained region and the second channel region.

12. The semiconductor device of claim 11, wherein an edge of the first strained region is aligned with an outer sidewall edge of the first spacer, and wherein an edge of the second strained region laterally extends within the substrate directly under the second spacer.

13. The semiconductor device of claim 11, further comprising a first lightly doped region formed within the substrate between the first strained region and the first gate, and a second lightly doped region formed within the substrate between the second strained region and the second gate.

14. The semiconductor device of claim 13, wherein first lightly doped region occupies less area within the substrate than the second lightly doped region.

15. The semiconductor device of claim 13, wherein the first lightly doped region extends into the first strained region and the second lightly doped region extends into the second strained region.

16. The semiconductor device of claim 13, wherein the first lightly doped region does not extend into the first strained region and the second lightly doped region does not extend into the second strained region.

17. The semiconductor device of claim 11, wherein the first spacer has a first maximum width and the second spacer has a second maximum width that is different than the first maximum width.

18. The semiconductor device of claim 11, wherein the first and second strained regions each include one of: a silicon germanium material and a silicon carbide material.

* * * * *